United States Patent
Um (10) Patent No.: US 10,395,930 B2
(45) Date of Patent: *Aug. 27, 2019

(54) SUBSTRATE TREATING APPARATUS AND SUBSTRATE TREATING METHOD

(71) Applicant: SEMES CO., LTD., Chungcheongnam-do (KR)

(72) Inventor: Youngje Um, Busan (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/854,198

(22) Filed: Dec. 26, 2017

(65) Prior Publication Data

US 2018/0182628 A1   Jun. 28, 2018

(30) Foreign Application Priority Data

Dec. 30, 2016  (KR) .................. 10-2016-0184131
Mar. 27, 2017  (KR) .................. 10-2017-0038216

(51) Int. Cl.
*H01L 21/263* (2006.01)
*H01L 21/67* (2006.01)

(52) U.S. Cl.
CPC ...... *H01L 21/263* (2013.01); *H01L 21/67017* (2013.01); *H01L 21/67028* (2013.01); *H01L 21/67173* (2013.01); *H01L 21/67178* (2013.01); *H01L 21/67207* (2013.01)

(58) Field of Classification Search
None
See application file for complete search history.

(56) References Cited

U.S. PATENT DOCUMENTS

2010/0043841 A1* 2/2010 Kaske .................. B05B 7/267
                                                    134/36
2017/0345686 A1* 11/2017 Choi ..................... B08B 5/00

FOREIGN PATENT DOCUMENTS

| JP | 2007088398 A | 4/2007 |
| JP | 2016076703 A | 5/2016 |
| KR | 20130080818 A | 7/2013 |
| KR | 20150021462 A | 3/2015 |

* cited by examiner

*Primary Examiner* — Asok K Sarkar
(74) *Attorney, Agent, or Firm* — Carter, Deluca & Farrell LLP (57) ABSTRACT

Disclosed are a substrate treating apparatus and a substrate treating method. The substrate treating apparatus includes a chamber providing an interior space for treating a substrate, a support unit provided in the chamber and configured to support the substrate, a first ejection unit having a first nozzle configured to supply a first cleaning medium in an aerosol state to the substrate supported by the support unit, and a second ejection unit having a second nozzle configured to supply a second cleaning medium to the substrate supported by the support unit.

16 Claims, 6 Drawing Sheets

SUBSTRATE TREATING APPARATUS AND SUBSTRATE TREATING METHOD

CROSS-REFERENCE TO RELATED APPLICATIONS

A claim for priority under 35 U.S.C. § 119 is made to Korean Patent Application No. 10-2016-0184131 filed on Dec. 30, 2016 and Korean Patent Application No. 10-2017-0038216 filed on Mar. 27, 2017, in the Korean Intellectual Property Office, the entire contents of which are hereby incorporated by reference.

BACKGROUND

Embodiments of the inventive concept relate to a substrate treating apparatus and a substrate treating method.

Contaminants such as particles, organic contaminants, and metallic contaminants on a surface of a substrate greatly influence the characteristics and yield rate of a semiconductor device. Due to this, a cleaning process of removing various contaminants attached to a surface of a substrate is very important, and a process of cleaning a substrate is performed before and after unit processes for manufacturing a semiconductor.

SUMMARY

Embodiments of the inventive concept provide a substrate treating apparatus that may efficiently treat a substrate, and a substrate treating method.

Embodiments of the inventive concept also provide a substrate treating apparatus and a substrate treating method which improves cleaning efficiency.

In accordance with an aspect of the inventive concept, there is provided a substrate treating apparatus including a chamber providing an interior space for treating a substrate, a support unit provided in the chamber and configured to support the substrate, a first ejection unit having a first nozzle configured to supply a first cleaning medium in an aerosol state to the substrate supported by the support unit, and a second ejection unit having a second nozzle configured to supply a second cleaning medium to the substrate supported by the support unit.

The second cleaning medium may be ejected in a liquefied state.

The first nozzle may move to an outside of the substrate after the supply of the first cleaning medium is initiated.

The second nozzle may move to the outside of the substrate after the supply of the second cleaning medium is initiated.

The second nozzle may initiate the supply of the second cleaning medium in a state in which the second nozzle is closer to the center of the substrate than the first nozzle.

The second nozzle may supply the second cleaning medium in a state in which the second nozzle is located above the center of the substrate.

An adjustment pipeline configured to manage a state of the interior space may be connected to the chamber.

The adjustment pipeline may supply an inert gas to the interior space.

The adjustment pipeline may emit a gas in the interior space to the outside.

The interior space may be in a vacuum state.

In accordance with another aspect of the inventive concept, there is provided a method for treating a substrate, the method including cleaning the substrate by supplying a first cleaning medium in an aerosol state and a second cleaning medium that is different from the first cleaning medium to the substrate.

The first cleaning medium may be carbon dioxide.

The second cleaning medium may be in a liquefied state.

A point at which the first cleaning medium is ejected may be farther from the center of the substrate than a point at which the second cleaning medium is ejected.

The substrate may be treated in a space filled with an inert gas.

The substrate may be treated in a space in a vacuum state.

In accordance with another aspect of the inventive concept, there is provided a method for treating a substrate, the method including cleaning the substrate by supplying a first cleaning medium in a gaseous state at a room temperature to the substrate and supplying a second cleaning medium in a gaseous state at a room temperature to the substrate while the second cleaning medium is in a phase state that is different from the phase state of the first cleaning medium.

The first cleaning medium may be supplied to the substrate in an aerosol state.

The second cleaning medium may be supplied to the substrate in a liquefied state.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Figure 1:
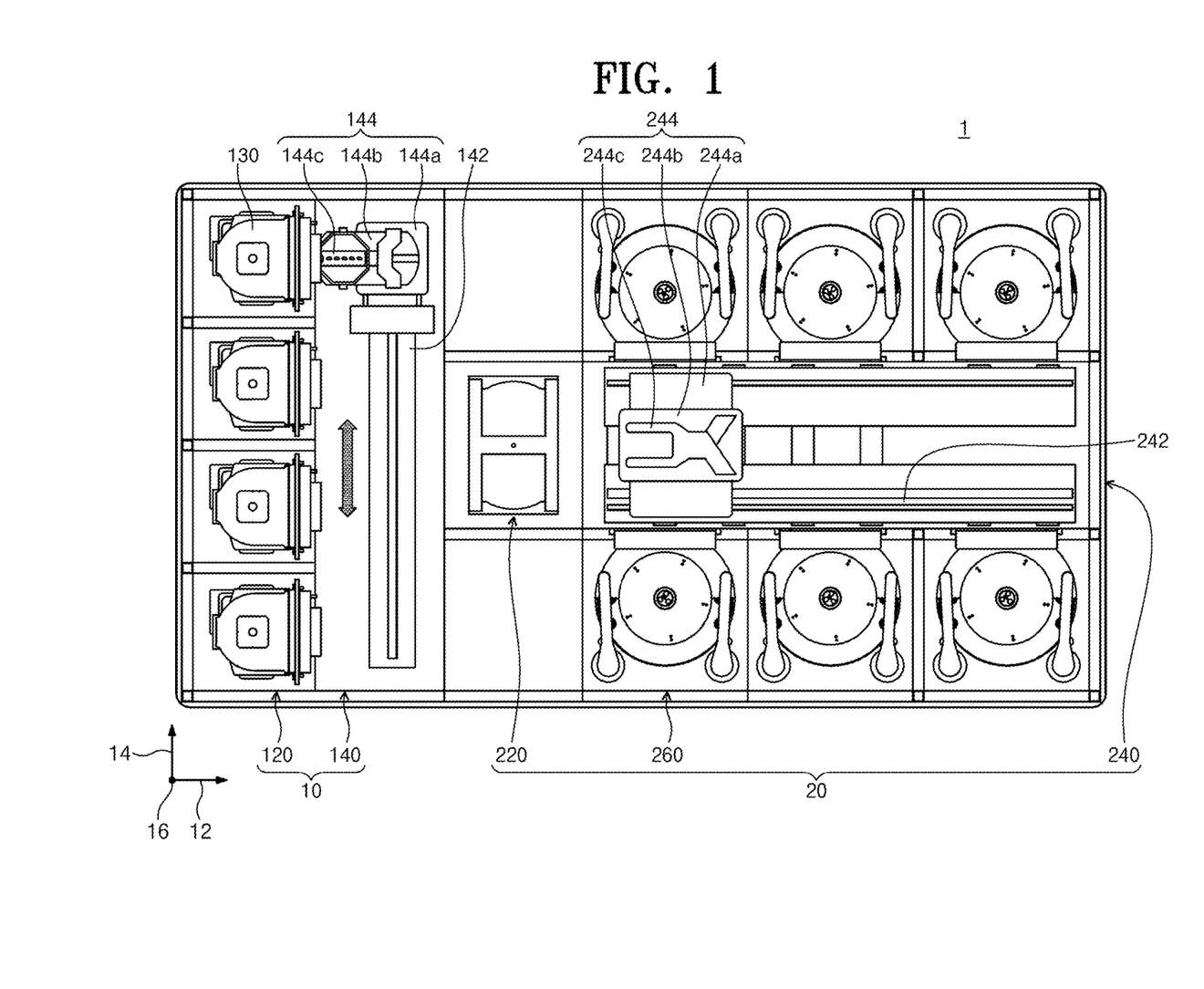
FIG. 1 is a plan view illustrating a substrate treating apparatus according to an embodiment of the inventive concept.

FIG. 1 is a plan view illustrating a substrate treating apparatus according to an embodiment of the inventive concept.

Referring to FIG. 1, the substrate treating apparatus 1 includes an index module 100 and a process executing module 200. The index module 100 includes a plurality of load ports 120 and a feeding frame 140. The load port 120, the feeding frame 140, and the process treating module 200 may be sequentially arranged in a row. Hereinafter, a direction in which the load port 120, the feeding frame 140, and the process treating module 200 will be referred to a first direction 12. A direction perpendicular to the first direction 12 when viewed from the top will be referred to as a second direction 14, and a direction normal to a plane including the first direction 12 and the second direction 14 will be referred to as a third direction 16.

A carrier 130, in which a substrate W is received, is seated on the load port 120. A plurality of load ports 120 are provided, and are disposed along the second direction 14 in a row. FIG. 1 illustrates that four load ports 120 are provided. However, the number of the load ports 120 may increase or decrease according to a condition, such as the process efficiency of the process treating module 200 or a footprint. A plurality of slots (not illustrated) provided to support peripheries of substrates W are formed in the carrier 130. A plurality of slots are provided in the third direction 16. The substrates W are stacked in the carrier 130 while being spaced apart from each other along the third direction 16. A front opening unified pod (FOUP) may be used as the carrier 130.

The process executing module 200 includes a buffer unit 220, a feeding chamber 240, and a plurality of process chambers 260. The feeding chamber 240 is disposed such that the lengthwise direction thereof is in parallel to the first direction 12. The process chambers 260 are disposed on opposite sides of the feeding chamber 240 along the second direction 14. The process chambers 260 situated on one side of the feeding chamber 240 and the process chambers 260 situated on an opposite side of the feeding chamber 240 are symmetrical to each other with respect to the feeding chamber 240. Some of the process chambers 260 are disposed along the lengthwise direction of the feeding chamber 240. Furthermore, some of the process chambers 260 are disposed to be stacked on each other. That is, the process chambers 260 having an array of A by B (A and B are natural numbers) may be disposed on one side of the feeding chamber 240. Here, A is the number of the process chambers 260 provided in a row along the first direction 12, and B is the number of the process chambers 260 provided in a row along the third direction 16. When four or six process chambers 260 are provided on one side of the feeding chamber 240, the process chambers 260 may be disposed in an array of 2 by 2 or 3 by 2. The number of the process chambers 260 may increase or decrease. Unlike the above-mentioned description, the process chambers 260 may be provided only on one side of the feeding chamber 240. Further, unlike the above-mentioned description, the process chambers 260 may be provided on one side or opposite sides of the feeding chamber 240 to form a single layer.

A buffer unit 220 is disposed between the feeding frame 140 and the feeding chamber 240. The buffer unit 220 provides a space in which the substrates W stay before being transported, between the feeding chamber 240 and the feeding frame 140. Slots (not illustrated) in which the substrates W are positioned are provided in the buffer unit 220, and a plurality of slots (not illustrated) are provided to be spaced apart from each other along the third direction 16. Faces of the buffer unit 220 that faces the feeding frame 140 and faces the feeding chamber 240 are opened.

The feeding frame 140 transports the substrates W between the carrier 130 seated on the load port 120 and the buffer unit 220. An index rail 142 and an index robot 144 are provided in the feeding frame 140. The index rail 142 is provided such that the lengthwise direction thereof is in parallel to the second direction 14. The index robot 144 is installed on the index rail 142, and is linearly moved in the second direction 14 along the index rail 142. The index robot 144 has a base 144a, a body 144b, and a plurality of index arms 144c. The base 144a is installed to be moved along the index rail 142. The body 144b is coupled to the base 144a. The body 144b is provided to be moved along the third direction 16 on the base 144a. The body 144b is provided to be rotated on the base 144a. The index arms 144c are coupled to the body 144b, and are provided to be moved forwards and rearwards with respect to the body 144b. A plurality of index arms 144c are provided to be driven individually. The index arms 144c are disposed to be stacked so as to be spaced apart from each other along the third direction 16. Some of the index arms 144c are used when the substrates W are transported to the carrier 130 in the process module 200, and some of the index arms 155 may be used when the substrates W are transported from the carrier 130 to the process treating module 200. This structure may prevent particles generated from the substrates W before the process treatment from being attached to the substrates W after the process treatment in the process of carrying the substrates W in and out by the index robot 144.

The feeding chamber 240 transports the substrates W between the buffer unit 220 and the process chambers 260, and between the process chambers 260. A guide rail 242 and a main robot 244 are provided in the feeding chamber 240. The guide rail 242 is disposed such that the lengthwise direction thereof is in parallel to the first direction 12. The main robot 244 is installed on the guide rail 242, and is linearly moved along the first direction 12 on the index rail 242. The main robot 244 has a base 244a, a body 244b, and a plurality of main arms 244c. The base 244a is installed to be moved along the guide rail 242. The body 244b is coupled to the base 244a. The body 244b is provided to be moved along the third direction 16 on the base 244a. The body 244b is provided to be rotated on the base 244a. The main arms 244c are coupled to the body 244b, and are provided to be moved forwards and rearwards with respect to the body 244b. A plurality of main arms 244c are provided to be driven individually. The main arms 244c are disposed to be stacked so as to be spaced apart from each other along the third direction 16. The main arms 244c used when the substrates W are transported from the buffer unit 220 to the process chambers 260 and the main arms 244 used when the substrates W are transported from the process chambers 260 to the buffer unit 220 may be different.

Process modules 300 that perform cleaning processes on the substrates W are provided in the process chambers 260. The process module 300 provided to the process chambers 260 may have different structures according to the types of the cleaning processes. Selectively, the process modules 300 in the process chambers 260 may have the same structure. Selectively, the process chambers 260 may be classified into a plurality of groups such that the structures of the process modules 300 in the process chambers 260 pertaining to the same group are the same and the structures of the process modules 300 in the process chambers 260 pertaining to different groups are different. For example, when the process chambers 260 are classified into two groups, the first group of process chambers 260 may be provided on one side of the feeding chamber 240 and the second group of process chambers 260 may be provided on an opposite side of the feeding chamber 240. Selectively, the first group of process chambers 260 may be provided on the lower side of the feeding chamber 240 and the second group of process chambers 260 may be provided on the upper side of the feeding chamber 240, on opposite sides of the feeding chamber 240. The first group of process chambers 260 and the second group of process chambers 260 may be classified according to the kinds of the used chemicals or the types of cleaning methods.

Figure 2:
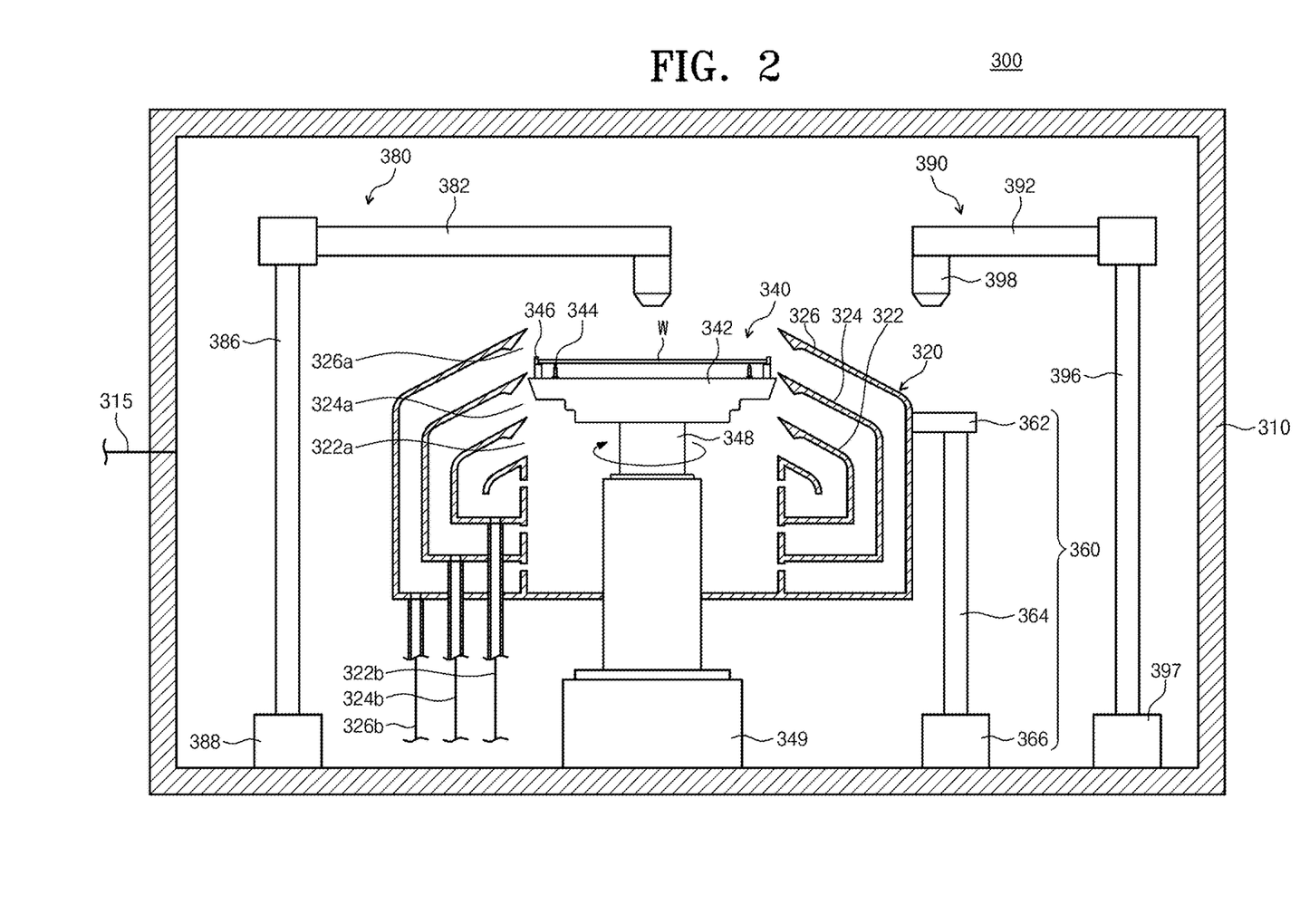
FIG. 2 is a view illustrating a process module according to an embodiment of the inventive concept.

FIG. 2 is a view illustrating a process module according to an embodiment of the inventive concept.

Referring to FIG. 2, the process module 300 includes a chamber 310, a cup 320, a support unit 340, an elevation unit 360, a first ejection unit 380, and a second ejection unit 390.

The chamber 310 provides a space in the interior thereof. The interior space of the chamber may be managed in a set state by an adjustment pipeline 315. The adjustment pipeline 315 is connected to one side of the chamber 310. The adjustment pipeline 315 adjusts a state of the interior space of the chamber 310. As an example, the adjustment pipeline may supply an inert gas into the interior space of the chamber 310, may emit air residing in the interior of the chamber 310, and may allow the interior space of the chamber 310 to be filled with an inert gas. Further, the adjustment pipeline 315 may emit the gas in the interior space of the chamber 310 to the outside, and may allow the interior space of the chamber 310 to be vacuumed. As the first cleaning medium and the second cleaning medium, which will be described below, are provided in low temperature states, the interior space of the chamber 310 is brought into a low temperature state. When the air including moisture and oxygen resides in the interior space of the chamber 310, moisture, oxygen, or the like may be condensed, which deteriorates the treatment quality of the substrate. The adjustment pipeline 315 may emit materials that may be condensed during the treatment process from the interior of the chamber 310. The inert gas supplied by the adjustment pipeline 315 may be an inert gas, such as nitrogen or helium, a freezing point of which is low.

The cup 320 is located in a space in the chamber 310. The cup 320 has a space for performing a substrate treating process, and an upper side of the cup 320 is opened. The cup 320 has an inner recovery vessel 322, an intermediate recovery vessel 324, and an outer recovery vessel 326. The recovery vessels 322, 324, and 326 recover different treatment fluids used in the process. The inner recovery vessel 322 has an annular ring shape that surrounds the support unit 340, the intermediate recovery vessel 324 has an annular ring shape that surrounds the inner recovery vessel 322, and the outer recovery vessel has an annular ring shape that surrounds the intermediate recovery vessel 324. An inner space 322a of the inner recovery vessel 322, a space 324a between the inner recovery vessel 322 and the intermediate recovery vessel 324, and a space 326a between the intermediate recovery vessel 324 and the outer recovery vessel 326 function as inlets 410 through which the treatment fluids are introduced into the inner recovery vessel 322, the intermediate recovery vessel 324, and the outer recovery vessel 326. Recovery lines 322b, 324b, and 326b extending from the recovery vessels 322, 324, and 326 perpendicularly in the downward direction of the bottom surfaces thereof are connected to the recovery vessels 322, 324, and 326, respectively. The recovery lines 322b, 324b, and 326b discharge the treatment liquid introduced through the recovery vessels 322, 324, and 326. The discharged treatment fluids may be reused through an external treatment fluid recycling system (not illustrated).

The support unit 340 is arranged in a treatment space of the cup 320. The support unit 340 supports and rotates the substrate during the process. The support unit 340 has a spin head 342, a plurality of support pins 344, a plurality of chuck pins 346, a drive shaft 348, and a driving unit 349. The spin head 342 has an upper surface having a substantially circular shape when viewed from the top. The drive shaft 348 that may be rotated by a driver 349 is fixedly coupled to the bottom of the spin head 342. If the driving shaft 348 is rotated, the spin head 342 is rotated. The spin head 342 includes a support pin 344 and a chuck pin 346 to support the substrate. A plurality of support pins 344 are provided. The support pins 344 may be arranged to be spaced apart from each other at a periphery of the upper surface of the spin head 342 and protrude upwards from the spin head 342. The support pins 344 are arranged to have a generally annular ring shape through combination thereof. The support pins 344 support a periphery of a bottom surface of the substrate such that the substrate W is spaced apart from the upper surface of the spin head 342 by a predetermined distance. A plurality of chuck pins 346 are provided. The chuck pins 346 are arranged to be more distant from the center of the spin head 342 than the support pins 344. The chuck pins 346 are provided to protrude upwards from the spin head 342. The chuck pins 346 support a side surface of the substrate such that the substrate is not separated laterally from a proper place when the support unit 340 is rotated. The chuck pins 346 are provided to be linearly moved between a standby position and a support position along a radial direction of the spin head 342. The standby position is a position that is more distant from the center of the spin head 342 than the support position. When the substrate is loaded on or unloaded from the support unit 340, the chuck pins 346 are located at the standby position, and when a process is performed on the substrate, the chuck pins 346 are located at the support position. The chuck pins 346 are in contact with the side of the substrate at the support position.

The elevation unit 360 linearly moves the cup 320 upwards and downwards. The elevation unit 360 may move the plurality of recovery vessels 322, 324, and 326 of the cup 320. Although not illustrated, the recovery vessels may be individually moved. When the cup 320 is moved upwards and downwards, a relative height of the cup 320 to the support unit 340 is changed. The elevation unit 360 has a bracket 362, a movable shaft 364, and a driver 366. The bracket 362 is fixedly installed on an outer wall of the cup 320, and the movable shaft 364 that is moved upwards and downwards by the driver 366 is fixedly coupled to the bracket 362. The cup 320 is lowered such that, when the substrate W is positioned on the support unit 340 or is lifted from the support unit 340, the support unit 340 protrudes to the upper side of the cup 320. When the process is performed, the height of the cup 320 is adjusted such that the treatment fluid is introduced into the preset recovery vessel 360 according to the kind of the treatment fluid supplied to the substrate W. For example, the substrate is located at a height corresponding to an interior space 322a of the inner recovery vessel 322 while the substrate is treated by a first treatment fluid. Further, the substrate may be located at a height corresponding to a space 324a between the inner recovery vessel 322 and the intermediate recovery vessel 324 and a space 326a between the intermediate recovery vessel 324 and the outer recovery vessel 326 while the substrate is treated by a second treatment fluid and a third treatment fluid. Unlike those described above, the elevation unit 360 may move the support unit 340, instead of the cup 320, upwards and downwards. Further, unlike the above description, the cup 320 may have a single recovery vessel 322.

The first ejection unit 380 supplies a first cleaning medium onto the substrate W. The first cleaning medium is a material in a gaseous state at a room temperature. The first cleaning medium is supplied to the substrate W in a non-liquid material state. The first cleaning medium may be supplied to the substrate in an aerosol state. As an example, the material supplied in an aerosol state may be one of carbon dioxide, argon, nitrogen, and helium, or may be a mixture of two or more of them.

The first ejection unit 380 may be swinging. The first ejection unit 380 has a nozzle support 382, a support 386, a driver 388, and a first nozzle 400. The lengthwise direction of the support 386 is provided along the third direction 16, and the driver 388 is coupled to a lower end of the support 386. The driver 388 rotates and elevates the support 386. The nozzle support 382 is coupled to an end of the support 386, which is opposite to an end of the support 386 coupled to the driver 388, perpendicularly to the support 386. The first nozzle 400 is installed on a bottom surface of an end of the nozzle support 382. The first nozzle 400 moves to a process location and a standby location by the driver 388. The process location is a location at which the first nozzle 400 is arranged at a vertical upper portion of the cup 320, and the standby location is a location that deviates from the vertical upper portion of the cup 320.

The second ejection unit 390 supplies a second cleaning medium onto the substrate W. The second cleaning medium is a material in a gaseous state at a room temperature. The second cleaning medium is supplied to the substrate in a phase state that is different from that of the first cleaning medium. The second cleaning medium is supplied to the substrate in a liquefied state. For example, the second cleaning medium may be liquefied nitrogen, liquefied carbon dioxide, liquefied argon, or liquefied helium.

The second ejection unit 390 may be rotated. The second ejection unit 390 has a second nozzle support 392, an auxiliary support 396, an auxiliary driver 397, and a second nozzle 398. The lengthwise direction of the auxiliary support 396 is provided along the third direction 16, and the auxiliary driver 396 is coupled to a lower end of the auxiliary support 397. The auxiliary driver 397 moves the auxiliary support 396. As an example, the auxiliary driver 397 may rotate the auxiliary support 396. Further, the auxiliary driver 397 may elevate the auxiliary support 396. The second nozzle support 382 is coupled to an upper side of the auxiliary support 396. The second nozzle 398 is installed on the bottom surface of an end of the second nozzle support 382. The second nozzle 398 moves to a process location and a standby location by the auxiliary driver 397. The process location is a location at which the second nozzle 398 is arranged at a vertical upper portion of the cup 320, and the standby location is a location at which the second nozzle 398 deviates from the vertical upper portion of the cup 320.

Figure 3:
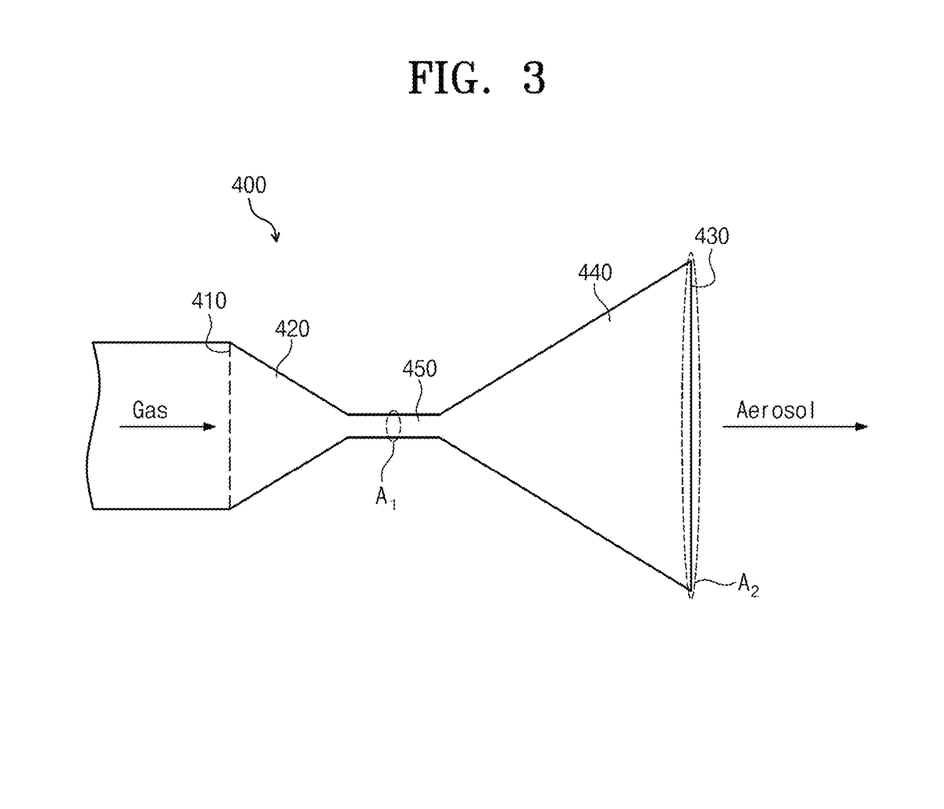
FIG. 3 is a view schematically illustrating an inner structure of a nozzle according to an embodiment.

FIG. 3 is a view schematically illustrating an inner structure of a nozzle according to an embodiment.

The first nozzle 400 has a contraction part 420, an expansion part 440, and an orifice 450. The contraction part 420, the orifice 450, and the expansion part 440 are sequentially provided. The contraction part 420 has an inlet 410. A first cleaning medium is introduced through the inlet 410. The cross-section of the contraction part 420 decreases as it goes far away from the inlet 410. For example, the contraction part 420 may have a conical shape.

The first cleaning medium introduced through the inlet 410 is in a gaseous state. The supply pressure of the introduced first cleaning medium may be bar to 60 bar. The supply pressure of the first cleaning medium may be 45 bar to 55 bar.

The expansion part 440 has an ejection hole 430. The ejection hole 430 ejects the first cleaning medium. The cross-section of the expansion part 440 increases as it becomes closer to the ejection hole 430. For example, the expansion part 440 may have a conical shape. When being ejected from the ejection hole 430, the first cleaning medium is ejected as solid particles.

The orifice 450 is located between the contraction part 420 and the expansion part 440. The orifice 450 may have a constant cross-sectional area along a lengthwise direction thereof.

The area of the ejection hole 430 may be 4 to 14 times as large as the cross-section of the orifice 450. The area of the ejection hole 430 may be 6 to 10 times as larger as the cross-section of the orifice 450.

That is, the area of the ejection hole 430 may be 4 to 14 times as large as the sectional area of the passage of the orifice 450, which is cut perpendicularly to a lengthwise direction of the orifice 450. Further, the area of the ejection hole 430 may be 6 to 10 times as large as the sectional area of the passage of the orifice 450.

According to an example, the diameter of the orifice 450 may be 0.24 mm to 0.6 mm, and the diameter of the ejection hole 430 may be 0.9 mm to 3.0 mm. Further, the diameter of the orifice may be 0.3 mm to 0.5 mm, and the diameter of the ejection hole may be 0.9 mm to 1.1 mm.

According to an example, the area of the orifice 450 may be 0.05 $mm^2$ to 0.28 $mm^2$, and the area of the ejection hole 430 may be 0.7 $mm^2$ to 7 $mm^2$. Further, the area of the orifice may be 0.10 $mm^2$ to 0.14 $mm^2$, and the area of the ejection hole may be 0.7 $mm^2$ to 1.4 $mm^2$.

Under the above-mentioned condition, the cleaning medium ejected from the ejection hole 430 may be ejected at a high speed and a high pressure such that the substrate may be sufficiently cleaned even without using a carrier gas. A cleaning efficiency of the substrate will be described with reference to an experimental result, which will be described below in relation to the above description.

Figure 4:
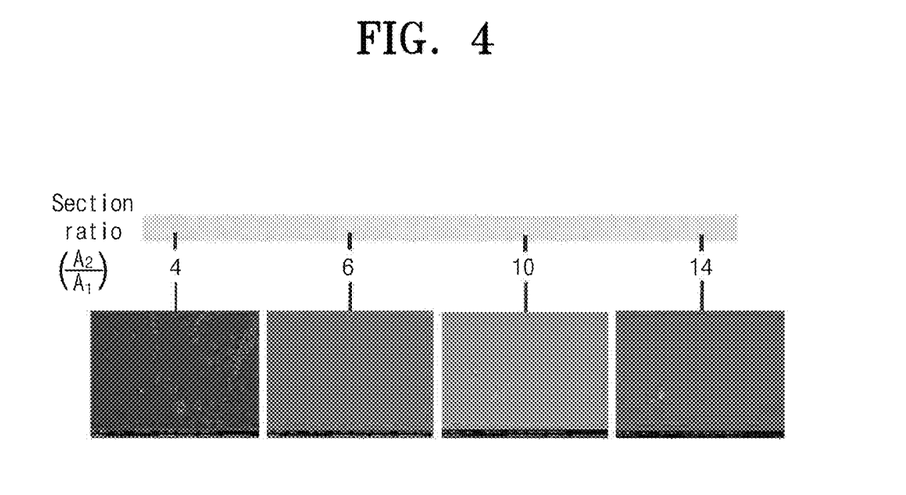
FIG. 4 illustrates pictures depicting a cleaning degree according to a ratio between areas of an orifice and an ejection hole.

FIG. 4 illustrates pictures depicting a cleaning degree according to a ratio between areas of an orifice and an ejection hole.

Hereinafter, the relatively bright dots in the pictures are impurities residing after the cleaning. It means that as a larger amount of bright dots is distributed, the cleaning is more incomplete.

The following experiments were performed by using only the first cleaning medium in a state in which the interior of the chamber is not vacuumed. Further, as the first cleaning medium, only carbon dioxide in a single gaseous state was supplied without using a separate carrier gas.

It can be seen from FIG. 4 that the substrate may be cleaned only with a single carbon dioxide gas when the ratio of the cross-sectional area A1 of the orifice 450 and the area A2 of the ejection hole 430 is 4 to 14. In particular, when the ratio of the cross-sectional area A1 of the orifice 450 and the cross-sectional area of the ejection hole 430 is 6 to 10, the impurities of the substrate are effectively cleaned.

Figure 5:
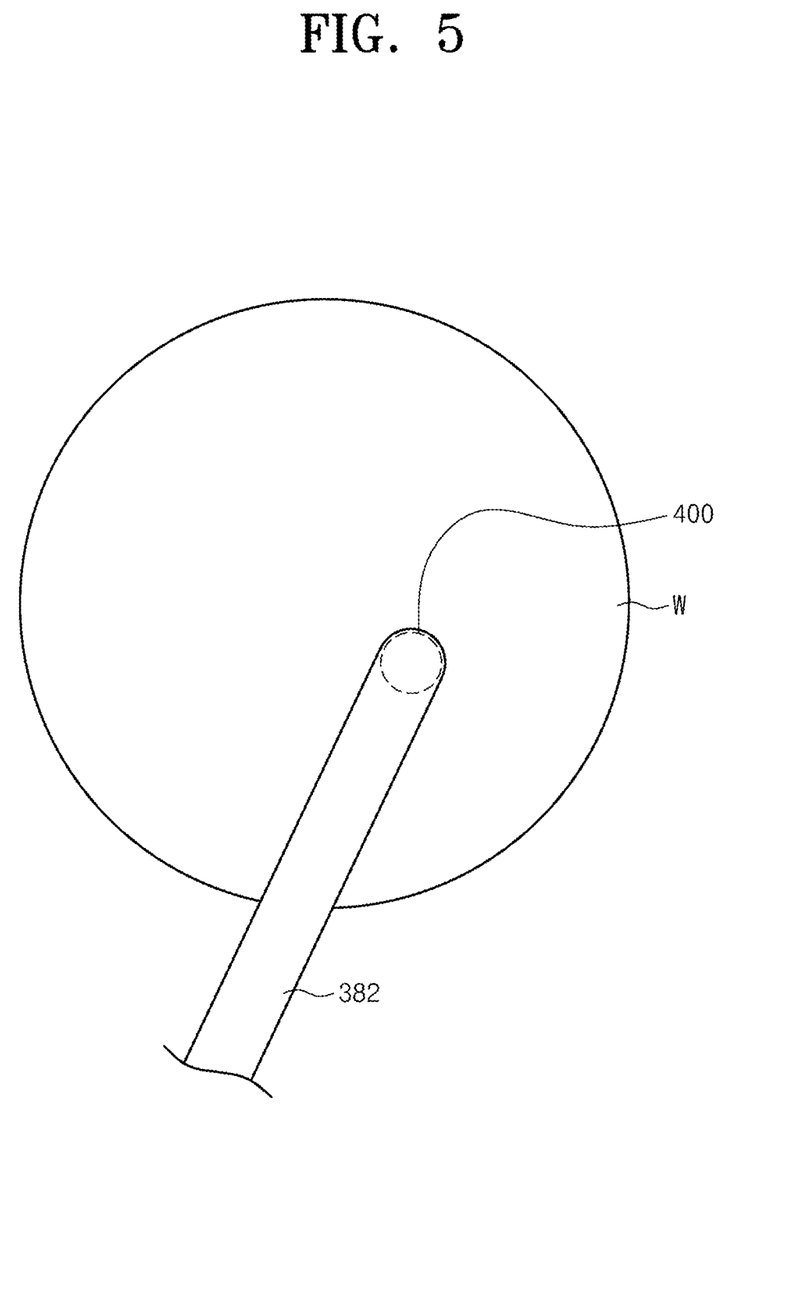
FIG. 5 is a view illustrating a state in which the first ejection unit cleans the substrate.

FIG. 5 is a view illustrating a state in which the first ejection unit cleans the substrate.

Referring to FIG. 5, the first ejection unit 380 cleans the substrate W by supplying the first cleaning medium to the substrate W. The cleaning of the substrate W by the ejection unit 380 may be initiated in a central area of the substrate W. As an example, the first nozzle may move to an outer area of the substrate W while ejecting the first cleaning medium after initiating the ejection of the first cleaning medium at the center of the substrate W. While the first nozzle 400 supplies the first cleaning medium, the substrate W may be rotated.

Figure 6:
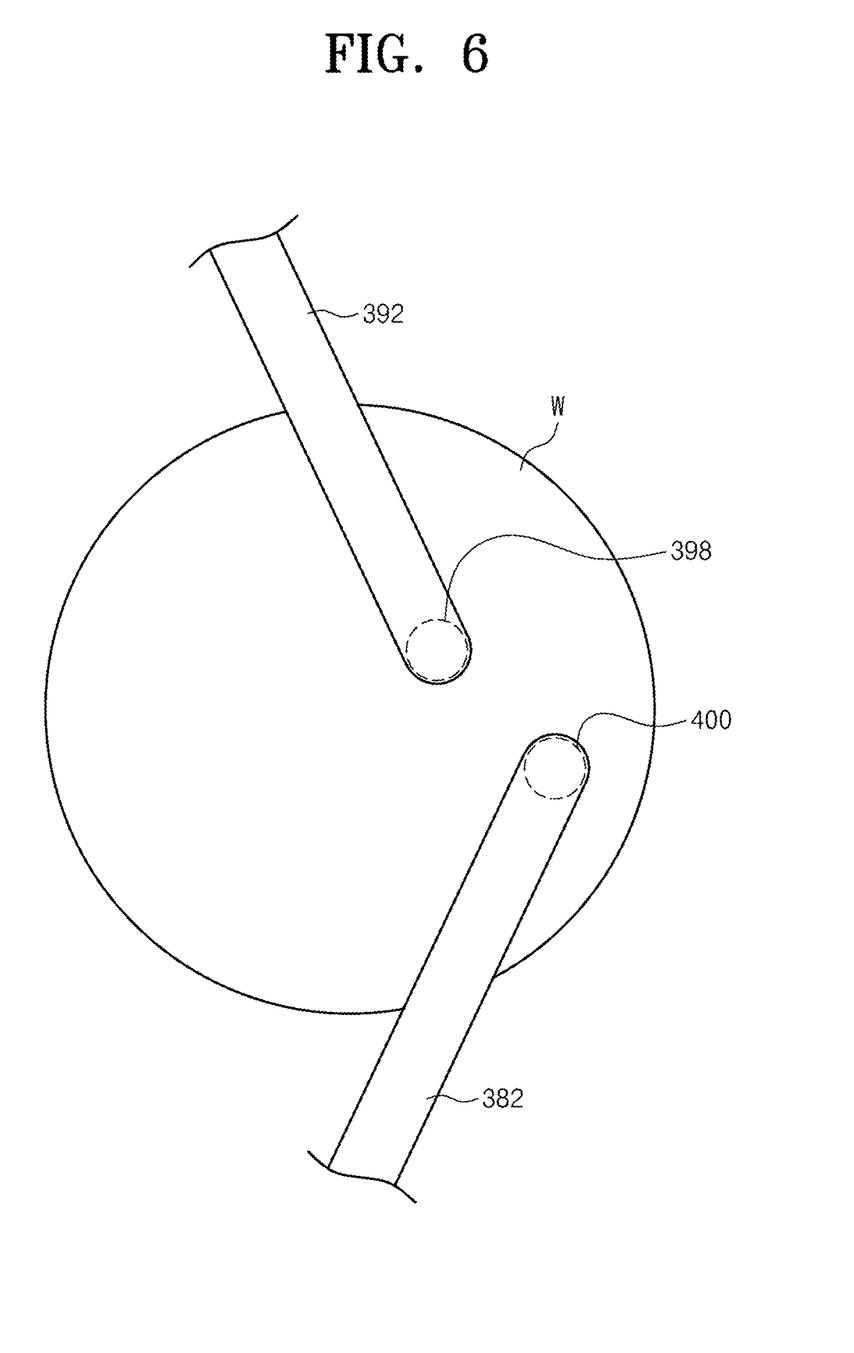
FIG. 6 is a view illustrating cleaning by the first ejection unit and a second cleaning medium supplying state by the second ejection unit.

FIG. 6 is a view illustrating cleaning by the first ejection unit and a second cleaning medium supplying state by the second ejection unit.

At the same time when the supply of the first cleaning medium is initiated or if a preset time period elapses after the supply of the first cleaning medium is initiated, the second ejection unit supplies the second cleaning medium to the substrate W.

When the supplies of the first cleaning medium and the second cleaning medium are simultaneously initiated, the first nozzle 400 supplies the first cleaning medium at a location that is spaced apart from the center of the substrate W by a preset distance toward the outside of the substrate W and the second nozzle 398 may initiate the supply of the second cleaning medium at a location that is closer to the center of the substrate W that the first nozzle 400. As an example, the second nozzle 398 may initiate the supply of the second cleaning medium while being located above the center of the substrate.

Further, when the supply of the second cleaning medium is initiated after a preset time period elapses after the supply of the first cleaning medium is initiated, the second nozzle may initiate the supply of the second cleaning medium at a location at which the second nozzle is closer to the center of the substrate W than the first nozzle which is moving toward the outside of the substrate W. As an example, the second nozzle 398 may initiate the supply of the second cleaning medium while being located above the center of the substrate W.

After the supply of the second cleaning medium is initiated, the second nozzle 398 may move toward the outside of the substrate W while supplying the second cleaning medium. Further, the second nozzle may supply the second cleaning medium for a preset period of time while being stopped at a point at which the supply of the second cleaning medium was initiated.

The second cleaning medium ejected to the substrate W may cleans the substrate W while moving toward the outside of the substrate W. Further, the second cleaning medium in a liquid state prevents particles scattering to an upper area of the substrate W due to the first cleaning medium from being attached to the substrate W again.

Figure 7:
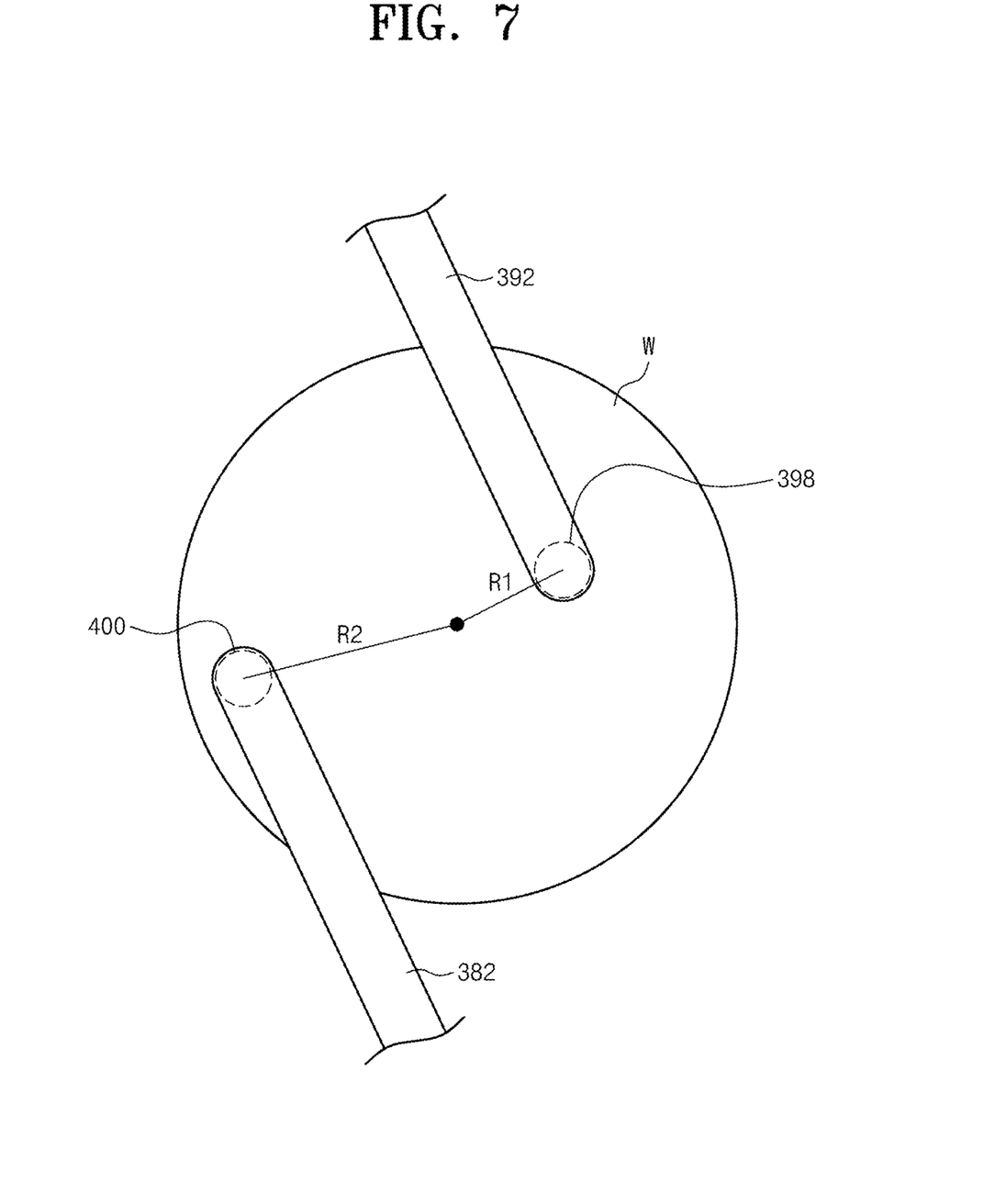
FIG. 7 is a view illustrating a locational relationship between the first ejection unit and the second ejection unit according to another embodiment.

FIG. 7 is a view illustrating a locational relationship between the first ejection unit and the second ejection unit according to another embodiment.

Referring to FIG. 7, the second ejection unit 390 may eject the second cleaning medium to the center of the substrate W while moving in a direction that is opposite to the movement direction of the first ejection unit 380. Then, a distance R1 from the center of the substrate W to the first nozzle 400 is larger than a distance R2 from the center of the substrate W to the second nozzle 398. Accordingly, similar to FIG. 6, the second ejection unit 390 may eject the second cleaning medium in a manner in which the scattering particles may be prevented from being attached to the substrate W, by the first cleaning medium.

According to an embodiment of the inventive concept, the substrate may be cleaned without using chemicals.

Further, according to an embodiment of the inventive concept, as a material having a low surface tension is used as a cleaning medium, a substrate having a hydrophobic surface and a substrate having fine patterns also may be efficiently cleaned.

Further, the second cleaning medium may clean the substrate while generating a freezing problem by the first cleaning medium as a gas having a low freezing point is used as the second cleaning medium.

According to an embodiment of the inventive concept, a substrate treating apparatus that efficiently treats a substrate and a substrate treating method may be provided.

According to an embodiment of the inventive concept, a substrate treating apparatus that has an improved cleaning efficiency and a substrate treating method may be provided.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A method for treating a substrate, the method comprising:
    cleaning the substrate by supplying a first cleaning medium in an aerosol state and a second cleaning medium that is different from the first cleaning medium to the substrate,
    wherein a point at which the first cleaning medium is supplied is farther from the center of the substrate than a point at which the second cleaning medium is supplied.

2. The method of claim 1, wherein the first cleaning medium is carbon dioxide.

3. The method of claim 1, wherein the second cleaning medium is in a liquefied state.

4. The method of claim 1, wherein the substrate is treated in a space filled with an inert gas.

5. The method of claim 1, wherein the substrate is treated in a space in a vacuum state.

6. The method of claim 1, wherein a section in which the second cleaning medium is supplied overlaps a section in which the first cleaning medium is supplied for a preset period of time.

7. The method of claim 1, wherein the first cleaning medium is supplied to the substrate without a carrier gas.

8. The method of claim 1, wherein the first cleaning medium is supplied to the substrate with a pressure of 20 bar to 60 bar.

9. The method of claim 1, wherein the second cleaning medium is at least one of liquefied nitrogen, liquefied carbon dioxide, liquefied argon, and liquefied helium.

10. The method of claim 1, wherein the second cleaning medium is supplied at a point closer to the center of the substrate after the first cleaning medium is supplied to the substrate.

11. The method of claim 1, wherein the second cleaning medium is supplied at a location directly above the center of the substrate after the supply of the first cleaning medium is initiated.

12. The method of claim 1, wherein the second cleaning medium is supplied to the substrate at a point closer to the center of the substrate than the first cleaning medium.

13. The method of claim 1, wherein the second cleaning medium is supplied towards the substrate from an outside of the substrate after the supply of the second cleaning medium is initiated.

14. A method for treating a substrate, the method comprising:
cleaning the substrate by supplying a first cleaning medium to the substrate and supplying a second cleaning medium to the substrate while the second cleaning medium is in a phase state that is different from the phase state of the first cleaning medium,
wherein the first cleaning medium is in a gaseous state at a room temperature and the second cleaning medium is in a liquid state at a room temperature, and
wherein a point at which the first cleaning medium is supplied is farther from the center of the substrate than a point at which the second cleaning medium is supplied.

15. The method of claim 14, wherein the first cleaning medium is supplied to the substrate in an aerosol state.

16. The method of claim 14, wherein the second cleaning medium is supplied to the substrate in a liquefied state.

* * * * *